United States Patent
Lee et al.

[11] Patent Number: 6,153,539
[45] Date of Patent: Nov. 28, 2000

[54] LIQUID PHASE DEPOSITION METHOD FOR GROWING A TITANIUM DIOXIDE ON A GALLIUM ARSENIDE SUBSTRATE

[75] Inventors: Ming-Kwei Lee; Wen-Han Hung, both of Kaoshiung, Taiwan

[73] Assignee: National Science Council of Republic of China, Taipei, Taiwan

[21] Appl. No.: 09/265,974

[22] Filed: Mar. 11, 1999

[51] Int. Cl.$^7$ ............................................. H01L 21/324
[52] U.S. Cl. .................. 438/767; 438/767; 438/653; 438/648; 428/432
[58] Field of Search ..................... 438/653, 648, 438/629, 209, 676, 677, 678; 428/432, 469, 472, 701, 703, 702, 419

[56] References Cited

U.S. PATENT DOCUMENTS

| | | | |
|---|---|---|---|
| 5,352,485 | 10/1994 | DeGuire et al. | 427/226 |
| 5,545,432 | 8/1996 | Deguire et al. | 427/226 |
| 5,595,813 | 1/1997 | Ogawa et al. | 428/212 |
| 5,811,192 | 9/1998 | Takahama et al. | 428/432 |
| 5,877,330 | 3/1999 | Kishimoto et al. | 549/240 |

*Primary Examiner*—Charles Bowers
*Assistant Examiner*—Laura M Schillinger
*Attorney, Agent, or Firm*—Bacon & Thomas

[57] ABSTRACT

A liquid phase deposition method for growing a titanium dioxide on the gallium arsenide substrate is disclosed. Wherein the solution of hexafluorotitanic acid ($H_2TiF_6$) is added with nitric acid ($HNO_3$) and boric acid ($H_3BO_3$) or only added with a nitric acid. Thus a titanium dioxide film is grown on the gallium arsenide substrate which is the most important material of semiconductor. The refractive index will achieve to a value of 2.5. The growth rate can be exactly controlled by the concentration of the nitric acid. The present invention has the advantages of lower cost and low growing temperature. Not only the industrial necessity is satisfied, but also the disadvantages from other growing process having a high cost and expensive equipment is avoided. Thus, the present invention is potentially used in the process of integrated circuits, such as being used in the memory structure with a higher dielectric constant.

Moreover, since the titanium dioxide has special photoelectric properties, which can be employed in the waveguides, optic filters, antireflecting coatings and other semiconductor elements of photoelectric compounds. From the experimental result, it is appreciated that the liquid phase deposition method for growing a titanium dioxide on the gallium arsenide substrate of the present invention is useful in many applications.

8 Claims, 4 Drawing Sheets

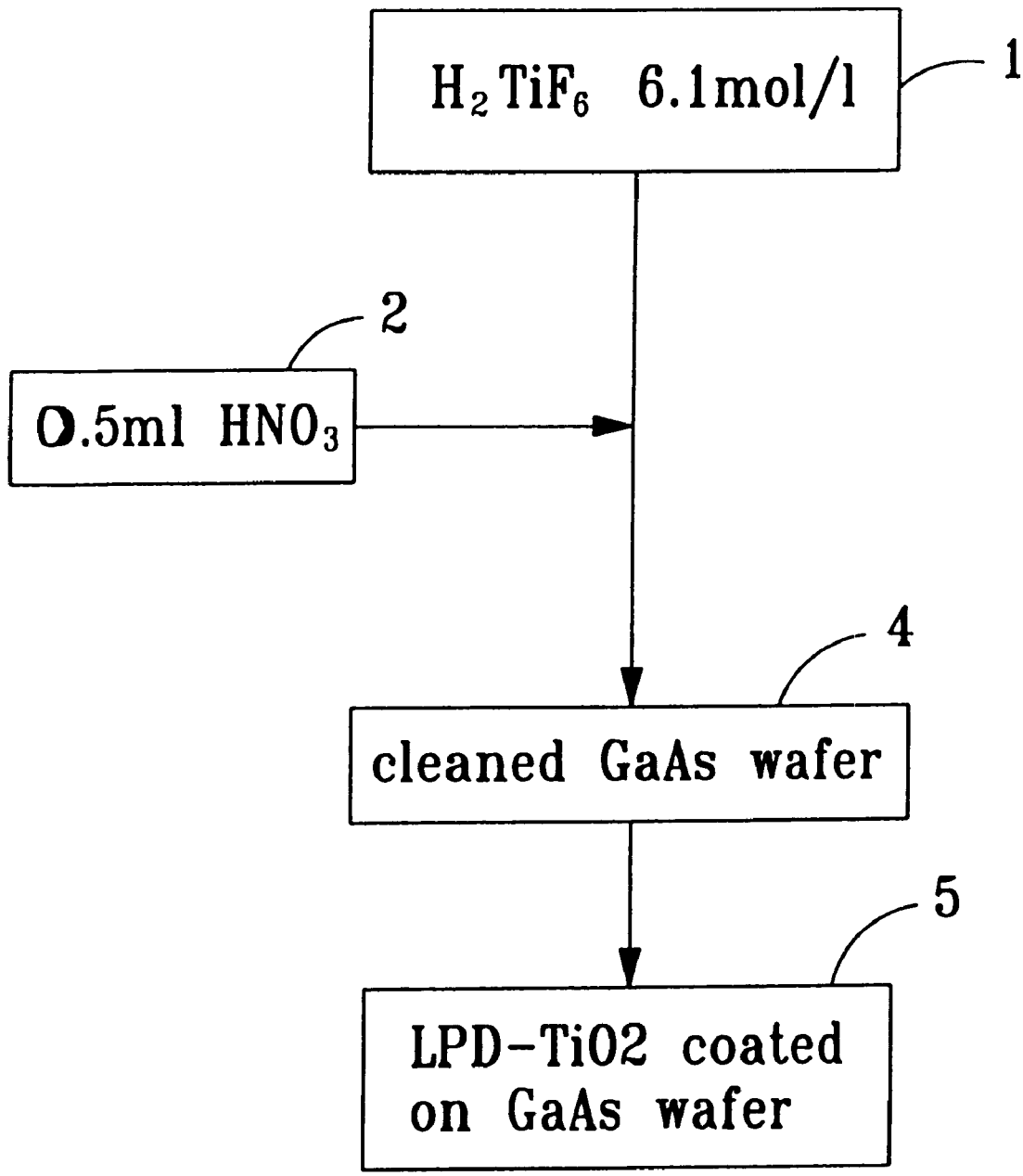
FIG. IA

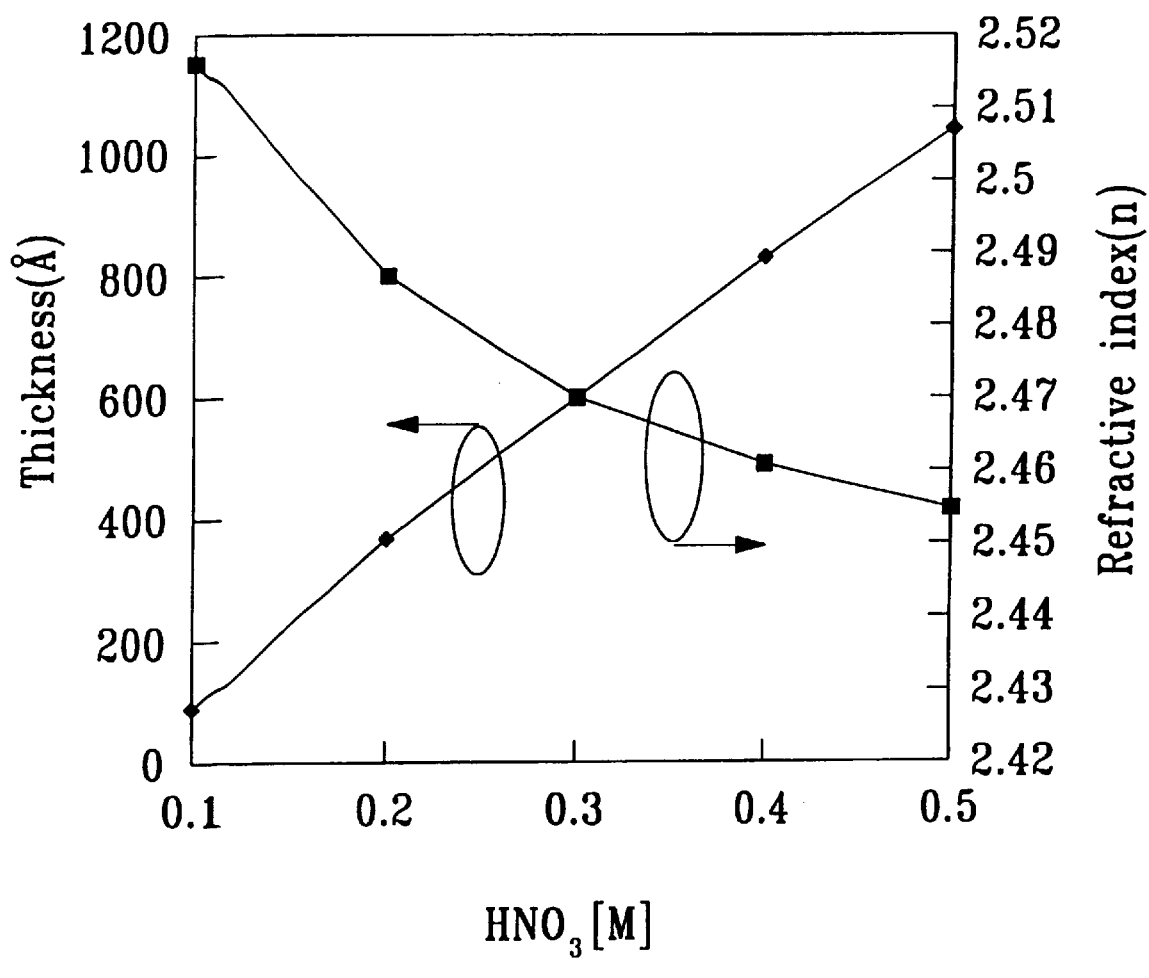
F I G. 2

LIQUID PHASE DEPOSITION METHOD FOR GROWING A TITANIUM DIOXIDE ON A GALLIUM ARSENIDE SUBSTRATE

BACKGROUND OF THE INVENTION

1. Field of the Invention

The present invention relates to a liquid phase deposition method for growing a titanium dioxide film on the gallium arsenide substrate, and in particular, to a liquid phase deposition method in which the solution of the hexafluorotitanic acid is added with a nitric acid and a boric acid or is only added with a nitric acid for growing a titanium dioxide film on the gallium arsenide substrate.

2. Description of the Prior Art

Gallium arsenide is most important material in the photoelectric semiconductor since the gallium arsenide has a direct energy gap and a high electron mobility, and it is suitable to fabricate high speed elements or photoelectric elements, for example, field effect transistors, laser diodes, light emitted diode, etc.

The material with higher dielectric constant, such as titanium dioxide film, is widely used in the manufacturing process of the silicon integrated circuit and the structure of semiconductor photoelectric elements of compound, for example:

(1) Since the titanium dioxide has the higher dielectric constant, it can be employed in the high capacity memory of silicon for example, DRAM . . . etc.

(2) Nowadays there are no metal oxide semiconductor field effect transistor (MOSFET) made by gallium arsenide. However, if there is a material with a smaller draining current serves as the gate oxide layer of the MOSFET, it is probable to develop that kind of element.

(3) Since the titanium dioxide has a higher refractive index, it can be matched with material of the lower refractive index to apply to waveguides, optic filters, antireflecting coatings and other semiconductor elements of photoelectric compounds.

Further, a mask is necessary in manufacturing gallium arsenide high speed element or photoelectric element, such as field effect transistors, laser diodes, light emitted diodes, etc. However, since gallium arsenide has no its own oxide layer to serve as a mask, thus the most frequently used methods of growing a titanium dioxide are:

(1) Reactive sputtering;

(2) Sol-gel growth in a temperature of 800° C., and (3) Low pressure chemical vaporizing deposition (PECVD) in a temperature of 400° C.

The high radiation from the sputtering will harm the elements during fabricating elements on the other hand, the high temperatures in the sol-gal and PECVD are also harmful to the elements. Further, the growth equipment is very expensive, thus the cost is increased.

Accordingly, the aforementioned prior arts have many defects, which is necessary to be improved.

SUMMARY OF THE INVENTION

Accordingly, the object of the present invention is to provide a liquid phase deposition method for growing a titanium dioxide film on the gallium arsenide substrate wherein the solution of a hexafluorotitanic acid ($H_2TiF_6$) is added with a nitric acid ($HNO_3$) and a boric acid ($H_3BO_3$) or only added with a nitric acid. Thus, a finer titanium dioxide film is grown and has a better electric property. Since the advantage of growing in low temperature (about 40° C. or a lower temperature). other disadvantage of growing in higher temperature is prevented. It can be well employed in the waveguides, optic filters, reflection-resistive layers and other semiconductor elements of photoelectric compounds. The present invention may be used in the following fields:

(1) MOSFET: In the elements of galliumn arsenide, if a material with a low drain current serves as the gate oxide layer of a MOSFET, the applications of the MOSFET can be enlarged.

(2) Photoelectric elements: Titanium dioxide has a higher refractive index, thus it can match with the material with lower refractive index, for example, silicon dioxide, so as to be employed in the photoelectric elements, such as waveguides, optic filters, antireflecting coatings, etc.

(3) Masking: Titanium dioxide has an erosion-tolerance property, it can be a mask of semiconductor elements of photoelectric compounds.

The liquid phase deposition method for growing a titanium dioxide on the gallium arsenide substrate, comprising:

(a) providing a general gallium arsenide chip as a substrate;

(b) adding a nitric acid or a boric acid or only adding a nitric acid to the solution of the hexafluorotitanic acid for growing a titanium dioxide film on the gallium arsenide substrate.

The reaction equations of using liquid phase deposition method for growing a titanium dioxide film on the gallium arsenide substrate are:

$$H_2TiF_6 + 2H_2O \Longleftrightarrow TiO_2 + 6HF \qquad (1)$$

$$H_3BO3 + 4HF \Longleftrightarrow BF^- + H_3O^+ + 2H_2O \qquad (2)$$

The equations (1) and (2) are analyzed in detail it will discover that the water solution of the hexafluorotitanic acid (H2TiF6) is firstly separated with titanium ion (Ti), then the titanium ion is combined with electric holes to form the $Ti^{4+}$, next, the $Ti^{4+}$ is combined with $OH^-$ in the water to generate $Ti(OH)_4$, the $OH^-$ is generated from the following equation:

$$H_2O \Longleftrightarrow OH^- + OH^+ \qquad (3)$$

Then the $Ti(OH)_4$ processes a dehydration reaction to generate TiO2 and H2O, the reaction equations are:

$$Ti + 4H^+ \rightarrow Ti^{4+} \qquad (4)$$

$$Ti^{4+} + 4OH^- \rightarrow Ti(OH)_4 \qquad (5)$$

$$Ti(OH)_4 \rightarrow TiO_2 + 2H_2O \qquad (6)$$

When growing on the silicon substrate, the chemical potential difference between the silicon and the electrolyte, the charge exchanges between silicon and electrolyte, and the surface of the silicon is lack of electrons. Namely, the silicon will supply electric hole to the surface thereof and then the equation (4) is occurred. However, gallium arsenide is a polarized semiconductor. The bondage is a covalent bond with ionic bonds, and the bonding strength is larger than that of silicon, but the electric hole is not easily provided to the surface. Therefore, growing in gallium arsenide substrate is very difficult. If electric hole can be sufficiently supplied to the surface of a gallium arsenide substrate, then the reaction will be performed well.

The Nitrous acid (HNO2) is contained in the nitric acid (TINO3). Thus, the nitrous acid and the nitric acid will react to generate electric holes the reaction equations is:

$$HNO_3 + HNO_2 \rightarrow N_2O_4 + H_2O \quad (7)$$

$$N_2O_4 <=> 2NO_2 \quad (8)$$

$$2NO_2 <=> 2NO_2^- + 2H^+ \quad (9)$$

$$2NO_2^- + 2H^+ <=> 2HNO_2 \quad (10)$$

It is known from above equations that the solution adding with nitric acid will generate electric holes so that the equation (4) can be performed on the gallium arsenide. The amount of the electric holes is proportional to the concentration of the nitric acid. During performing the reaction in equation (4), the concentration of nitric acid may be used to increase the growth rate of the titanium dioxide on the gallium arsenide.

In the liquid phase deposition method, a hexafluorotitanic acid is added to a nitric acid or a boric acid as a material for growing a titanium dioxide film on the gallium arsenide.

The present invention will be more understood to its numerous objects and advantages became apparent to those skilled in the art by referencing to the following drawings in which:

BRIEF DESCRIPTION OF THE DRAWINGS

FIG. 1(A) is a flow diagram for the experiment of the liquid phase deposition method used to grow a titanium dioxide film on a gallium arsenide substrate.

FIG. 2 shows the relation between the concentration of a nitric acid to the thickness of the LPD-TiO2 film for the liquid phase deposition method used to grow a titanium dioxide film on a gallium arsenide substrate.

DETAILED DESCRIPTION OF THE PREFERRED EMBODIMENT

Referring to FIG. 1(A), a flow diagram for the experiment of the liquid phase deposition method used to grow a titanium dioxide on a gallium arsenide substrate. Wherein nitric acid 2 with the volume of 0.5 ml (70% wt) is added into the solution of hexafluorotitanic acid with a volume of 20 ml and a concentration of 6.10 mole/liter. Then the volume of the nitric acid is used as a variable and a cleaning gallium arsenide chip 4 is putted into the solution, growing a titanium dioxide film 5 on the chip under a temperature of 40° C. From the final result, it is apparent that the liquid phase deposition method can be substantially used to grow a titanium dioxide film 5 on the gallium arsenide chip.

Figure 1B:
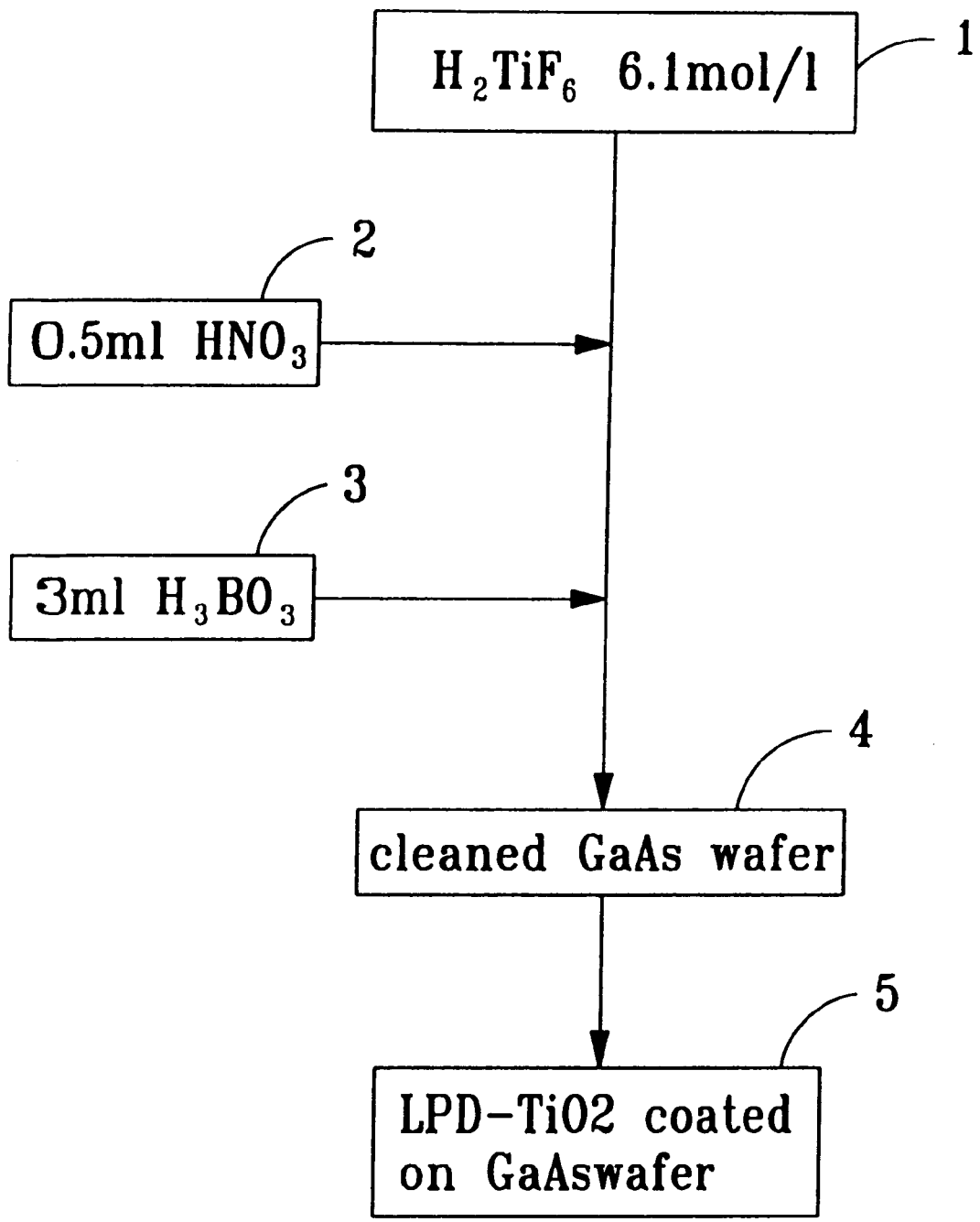
FIG. 1(B) a flow diagram for the another experiment of the liquid phase deposition method used to grow a titanium dioxide on a gallium arsenide substrate.

Referring to FIG. 1(B), a flow diagram for the another experiment of the liquid phase deposition method used to grow a titanium dioxide on a gallium arsenide substrate. Wherein a nitric acid 2 with the volume of 0.5 ml (70% wt) and a boric acid with the volume of 3 ml and the concentration of 0.3 mole/liter are added to the solution of hexafluorotitanic acid with the volume of 20 ml and a concentration of 6.10 mole/liter. Then the volume of the nitric acid is used as the variable and the cleaning gallium arsenide chip 4 is put into the solution for growing a titanium dioxide film 5 on the chip under a temperature of 40° C. From the final result, it is apparent that the liquid phase deposition method can be substantially used to grow a titanium dioxide film 5 on the gallium arsenide chip Referring to FIG. 2, the relation between the concentration of a nitrc acid to the thickness of the LPD-TiO2 film for the liquid phase deposition method used to grow a titanium dioxide on a gallium arsenide substrate is illustrated. It is the result of the experiment shown in FIG. 1(A), wherein the growth condition for titanium dioxide is: hydrofluoric titanic acid with a volume of 20 ml, nitric acid with a volume of 0.5 ml, the concentration is ranged between 0.1 M to 0.5 M with 40° C. of growth temperature and a growth time of 8 minutes. It is appreciated that the thickness of the film will increase with the concentration of the nitric acid, and the growth rate is increased from 13.7 Å to 129.7 Å, whereas the refractive index reduces with the concentration of the nitric acid from 2.516 to 2.455 since the refractive index is inverse proportional to the growth rate.

Figure 3:
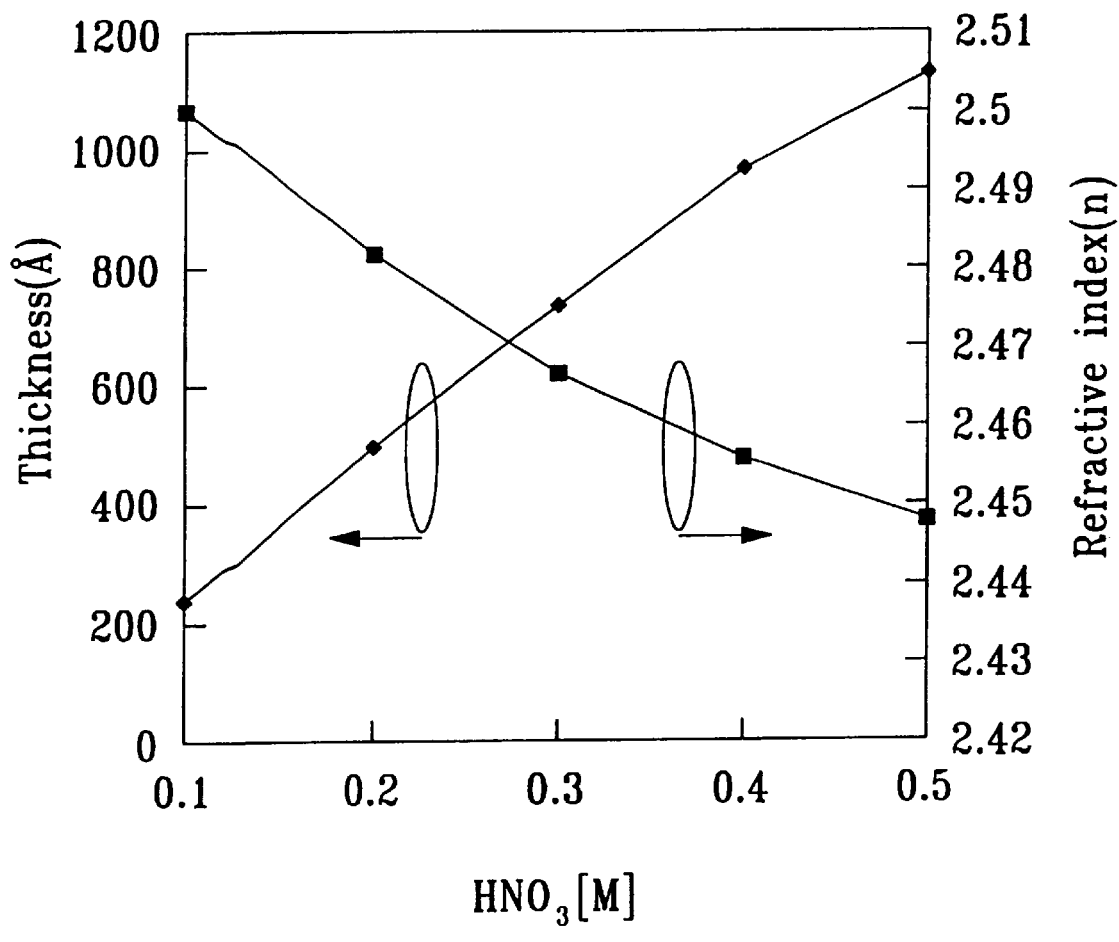
FIG. 3 shows the relation between the concentration of a nitric acid to the thickness of the TiO2 film and refractive index for the liquid phase deposition method used to grow a titanium dioxide on a gallium arsenide substrate.

Referring now to FIG. 3, the relation of the concentration of a nitric acid to the thickness of the TiO2 film and refractive index for the liquid phase deposition method used to grow titanium dioxide on the gallium arsenide substrate is illustrated, wherein boric acid of 0.3 M and 3 ml is added into the solution. It is the result of the experiment shown in FIG. 1(B), wherein the growth condition for titanium dioxide is: hexafluorotitanic acid with the volume of 20 ml, nitric acid with the volume of 0.5 ml, the concentration is 0.2 M with 40° C. of growth temperature and a growth time of 8 minutes. It is appreciated that the thickness of the film will increase with the concentration of the nitric acid, and the growth rate is increased from 29.5 Å to 140 Å, whereas the refractive index reduces with the concentration of the nitric acid from 2.501 to 2.488 since the refractive index is inverse proportional to the concentration of the nitric acid. The nitric acid will consume hydrofluoric acid, the reaction equation is shown in FIG. (2) and hence the reduction of the hydrofluoric acid will cause the reaction equation (1) to react toward the right side of the equation. As a result, more titanium ions are generated. Apparently, the growth rate shown in FIG. 1(B) will be quicker than that in FIG. 1(A).

The liquid phase deposition method used to grow a titanium dioxide on a gallium arsenide substrate of the present invention is the following advantages as compared with the prior art methods:

1. The liquid phase deposition method of the present invention simplifies the fabrication method and the equipment, which improves the reliability of components and reduces the depth of the combining surface. As a consequence, the components have better properties.

2. In the photoelectric semiconductor of gallium arsenide, such as waveguides or optic filters. The material with lower refractive indexes, for example, a silicon dioxide, needs to match with a material with higher refractive index, for example, titanium dioxide. Therefore, titanium dioxide grown on the gallium arsenide substrate is sufficient to satisfy the necessity of a MOSFET or a photoelectric element.

3. In general, a titanium dioxide is grown in high temperature, and this is not only harmful to other elements, but also diffusions to each other. Whereas the liquid phase deposition method of the present invention is performed in low temperature. Accordingly, the above disadvantages will be improved greatly.

Although the present invention has been described using specified embodiment, the examples are meant to be illustrative and not restrictive. It is clear that many other variations would be possible without departing from the basic approach, demonstrated in the present invention. Therefore, all such variations are intended to be embraced within the scope of the invention as defined in the appended claims.

[1] H. Nagayama, H. Honda, and H Kawahara, "A New Process for Sili Coating", J. Electrochem. Soc. Vol. 135, pp. 2013–2016, 1998.

[2] L. J. Meng and M. P. Santos, "Investigations of Titanium Oxide Films Deposited by D. C. Reactive Magnetron Sputtering in Different Sputtering Pressures" Thin Solid Films, 226, pp.22–29, 1993.

[3] H. Tada and U. Honda, "Photocatalytic Activity of TiO2 Film Coated on Internal Lightguide" J. Electrochem. Soc., 142, pp.3438–3443, 1995.

[4] H. Y. Lee and H. G. Kim, "The Role of Gas-Phase Nucleation in The Preparation of TiO2 Films by Chemical Vapor Deposition" Thin solid Films, 229, pp.187–191, 1993.

[5] Sorab K. Ghandhi, "VLSI Fabrication Principles Silicon and Gallium Arsenide" $2^{nd}$ Wiley, N.Y., P. 489.

[6] Sorab K- Ghandhi, "VLSI Fabrication Principles Silicon and Gallium Arsenide" $2^{nd}$ Wiley, N.Y., P. 591.

What is claimed is:

1. A liquid phase deposition (LPD) method for growing a titanium dioxide film on a gallium arsenide substrate, comprising:
   (c) providing a general gallium arsenide chip as a substrate; and
   (d) growing a titanium dioxide film on the substrate; wherein
       in the liquid phase deposition method, a hexafluorotitanic acid is added to a nitric acid or a boric acid as the material for growing a titanium dioxide film on the gallium arsenide.

2. The method as recited in claim 1, wherein the solution of the hexafluorotitanic acid is added with a nitric acid and a boric acid or is only added with a nitric acid for growing a titanium dioxide film on the gallium arsenide substrate.

3. The method as recited in claim 1, wherein the concentration of the boric acid or the volume of the solution of the boric acid is adjusted in order to control the growth rate and refractive index of the titanium dioxide film.

4. The method as recited in claim 1, wherein the concentration of the nitric acid or the volume of the solution of the nitric acid can be adjusted in order to control the growth rate and refractive index of the titanium dioxide film.

5. The method as recited in claim 1, wherein the growth temperature of titanium dioxide is ranged from 5° C. to 90° C. or within a wider range in order to control the growth rate or refractive index of a titanium dioxide film.

6. The method as recited in claim 1, wherein the gallium arsenide chip is substituted by a zinc selenide.

7. The method as recited in claim 1, wherein the gallium arsenide chip is substituted by indium phosphide.

8. The method as recited in claim 1, wherein the growth time of a titanium dioxide is adjusted according to the desired thickness.

* * * * *